United States Patent [19]
Conner

[11] 3,813,586
[45] May 28, 1974

[54] MATCHED PAIR OF ENHANCEMENT MODE MOS TRANSISTORS

[75] Inventor: Michael E. Conner, Long Green, Md.

[73] Assignee: The United States of America as represented by the Secretary of the Navy, Washington, D.C.

[22] Filed: Mar. 7, 1973

[21] Appl. No.: 338,794

[52] U.S. Cl. ...... 317/235 R, 317/235 B, 317/235 G
[51] Int. Cl. .......... H01l 11/00
[58] Field of Search .......... 317/235

[56] References Cited

UNITED STATES PATENTS

| | | | |
|---|---|---|---|
| 3,465,293 | 9/1969 | Weckler | 340/166 |
| 3,477,031 | 11/1969 | Nagata | 330/30 |
| 3,478,229 | 11/1969 | Avery | 307/303 |
| 3,652,906 | 3/1972 | Christensen | 317/235 |

*Primary Examiner*—John S. Heyman
*Assistant Examiner*—E. Wojciechowicz
*Attorney, Agent, or Firm*—Edward J. Kelly; Herbert Berl

[57] ABSTRACT

A method and apparatus for matching the DC current-voltage characteristics of two MOS enhancement mode transistors. The method interdigitates pieces of two transistors in such a way that the average characteristic of the two transistors is the same while conserving as much area as possible. The matching of the average characteristic of the two transistors is due to a topological layout that preserves the gates of the transistors in close proximity to one another. The gate oxide for both transistors is deposited in one long continuous strip. The gate electrodes for the two devices are divided into several parallel connected pieces. The pieces of each gate are deposited in alternating positions along the length of the gate oxide. The interconnection of the gates, sources, and drains are then made in such a way so as to keep the diffused viae as short as possible thus minimizing the series drain and source resistances. The topology disclosed herein also obviates the need for two layers of metalization.

7 Claims, 9 Drawing Figures

MATCHED PAIR OF ENHANCEMENT MODE MOS TRANSISTORS

RIGHTS OF GOVERNMENT

The invention described herein may be manufactured, used, and licensed by or for the United States Government for governmental purposes without the payment to me of any royalty thereon.

BACKGROUND OF THE INVENTION

1. Field of the Invention

This invention relates to a pair of complementary enhancement mode MOS transistors and, more particularly, to a method and apparatus for matching the average characteristic of the two transistors while conserving as much area as possible.

2. Description of the Prior Art

One of the main difficulties in the manufacture of linear integrated MOS-FET circuits is the variation in operating point from transistor to transistor having identical geometries. These variations are largely due to the variation of the charges found in the insulating gate oxide which are unavoidably introduced by trace contamination during the processing of MOS devices. If the overall quality of the gate oxide was very nearly the same for two transistors having the same geometry, then the match of the operating points (or, equivalently, the match of the threshold voltages $V_t$) would be quite close.

It is therefore a primary object of the present invention to ensure that the gate oxides associated with a pair of complimentary MOS transistors are very nearly the same while making the entire device as small as possible.

Another object of the present invention is to provide a method of matching the DC I-V characteristics of two MOS enhancement mode transistors.

An additional object of the present invention is to provide a method of matching the characteristics of two complimentary pairs of MOS enhancement mode transistors that interdigitates pieces of the two transistors in such a way that their average characteristics are the same while conserving as much area as possible.

A still further object of the present invention is to provide a pair of complimentary MOS enhancement mode transistors in which the series drain and source resistances are minimized while the need for two layers of metalization is obviated.

A still additional object of the present invention is to provide a topological layout for a complimentary pair of MOS transistors in which the close proximity of the gates provides a very close characteristic match of the two devices.

SUMMARY OF THE INVENTION

Briefly, in accordance with the invention, a method and apparatus providing a matched pair of enhancement mode MOS transistors is provided which comprises a semiconductor substrate, typically an N-type silicon substrate, into which a plurality of pairs of diffused regions of P-type semiconductor material are formed. A gate oxide is grown along the surface of the substrate in a single continuous strip which is located so as to bridge each of the said pairs of diffused regions. Portions of the gate oxide strip so grown serve as the gate portion of each of said pair of MOS devices. The diffused regions that correspond to the source and drain for the first of said pair of devices is located along the length of the gate oxide strip in alternating positions to the pairs of diffused regions that correspond to the second of said pair of devices. Similarly, the gate electrodes for each of said pair of devices are alternately formed over said gate oxide strip in positions corresponding to the respective diffused regions of the two devices. The source, drain, and gate electrode connections are all made in parallel for each of the pair of complimentary devices and interdigitate one another topologically.

BRIEF DESCRIPTION OF THE DRAWING

The specific nature of the invention as well as other objects, aspects, uses, and advantages thereof will clearly appear from the following description and from the accompanying drawing, in which.

DESCRIPTION OF THE PREFERRED EMBODIMENT

Figure 1:
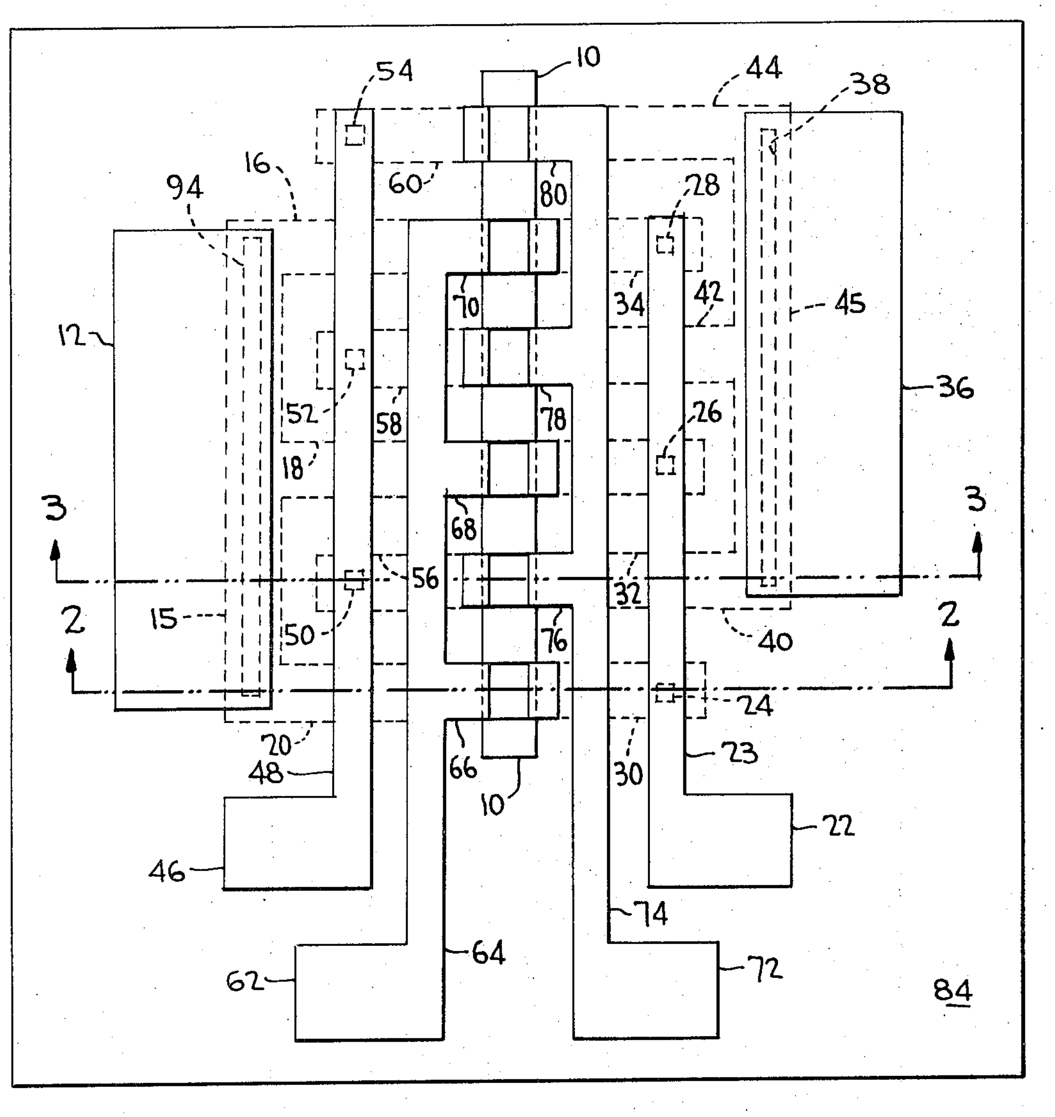
FIG. 1 illustrates a top view of a preferred embodiment of an integrated circuit that embodies the principles of the present invention.
Figure 2:
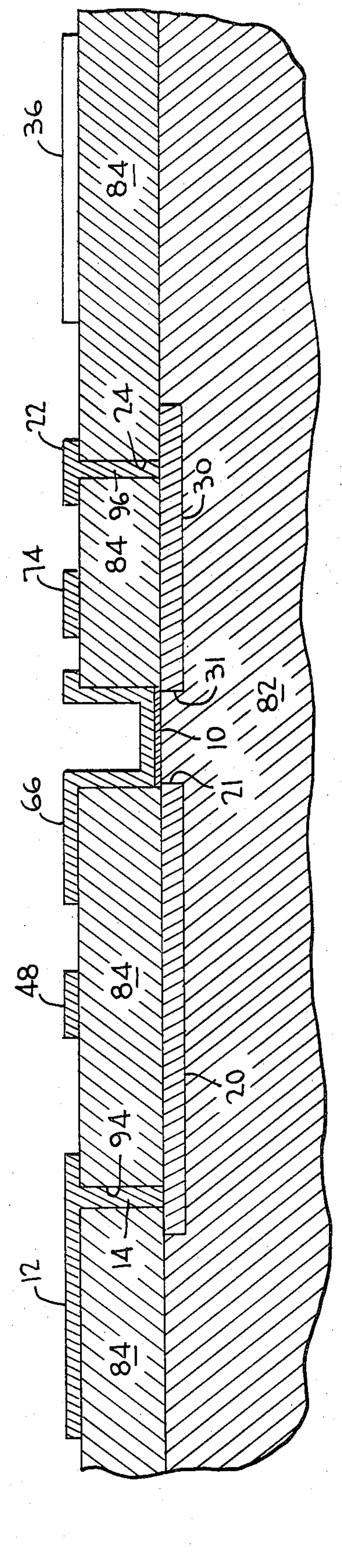
FIG. 2 illustrates a cross section of FIG. 1 taken along line 2—2.
Figure 3:
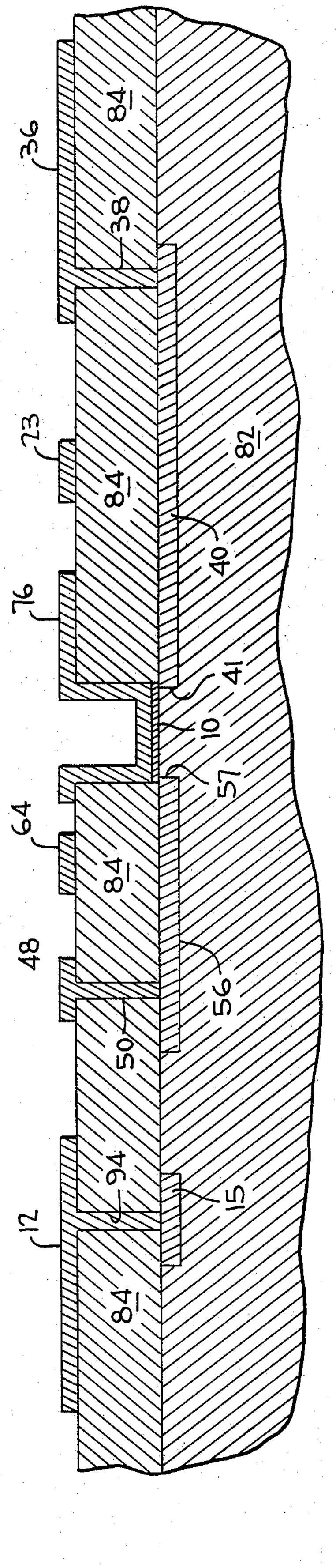
FIG. 3 illustrates a cross section of FIG. 1 taken along line 3—3 of FIG. 1.

FIG. 1 illustrates an overview of the schematic layout or topology associated with the device of the present invention. Integrated circuit chip 8 is shown to consist of two complimentary enhancement mode MOS transistors, which have as their main feature a single long continuous strip of gate oxide 10 which serves as a common gate insulator for both of said pair of transistors. The pad 12 serves as a connector to diffused regions 15, 16, 18 and 20, which basically comprise one diffused region, that are formed below the mask 84 which generally comprises a film of silicon dioxide through which the impurities that comprise regions 15, 16, 18 and 20 are introduced. The substrate 82, more clearly seen in FIGS. 2 and 3, is generally comprised of bulk silicon, an N-type semiconductor. Thus, in accordance with well known MOS technology, diffused regions 15, 16, 18 and 20 will be comprised mainly of a P-type semiconductor impurity. A contact opening 94 is provided through mask 84 such that an electrical connection can be effectuated between the diffused regions 15, 16, 18 and 20 and pad 12. Pad 12 comprises the source connection for one of the complimentary pairs of transistors. In line with diffused regions 16, 18 and 20 but on the opposite side of gate oxide 10 are located diffused regions 34, 32 and 30 respectively, which also are comprised of a P-type semiconductor impurity. Diffused regions 34, 32 and 30 also lie below mask 84 and means are provided for connecting said diffused regions to pad 22 via contact opening 28, 26 and 24 respectively. Pad 22 serves as the drain connector for the first of said complimentary pair of transistors. Associated with the source 12 and the drain 22 of the first of said transistor pair is pad 62 which serves as the gate connector for the first of said complimentary pair of transistors. Pad 62 is connected to gate oxide 10 via metalized strips 64, 66, 68 and 70. Strips 66, 68 and 70 are deposited directly over gate oxide 10. Thus it is seen that in the preferred embodiment presented in FIG. 1, the first of said complimentary pair of MOS transistors is represented by source pad 12, drain pad 22, and gate pad 62, which are comprised of three distinct parallel connected sections: diffused regions 16 and 34 and strip 70; diffused regions 18 and 32 and strip 68; and diffused regions 20 and 30 and strip 66. Located in alternating positions along the length of gate oxide 10 are the components of the second of said complimentary pair of MOS transistors. The source pad 36 is connected via contact opening 38 to diffused regions 45, 44, 42 and 40, which are diffused into substrate 82 through mask 84 and basically comprise one diffused region. On the opposite side of gate 10 in substantial alignment with diffused regions 44, 42 and 40 are diffused regions 60, 58 and 56 which are connected to drain pad 46 by means of contact openings 54, 52 and 50 respectively, and metalization strip 48. Associated with the three sets of diffused regions for the second of said transistor pair are gate contact strips 80, 78 and 76 which are connected to gate pad 72 by means of metalization strip 74. Strips 80, 78 and 76 are deposited directly over portions of gate oxide strip 10. It is again seen that the second of said transistor pair consists of three distinct sections: diffused regions 44 and 60 and strip 80; diffused regions 42 and 58 and strip 78; and diffused regions 40 and 56 and strip 76. Thus, the gate connections of the complimentary pair of MOS transistors are interdigitated along a single continuous gate oxide strip 10. It can be appreciated that the gate connections provided thereby physically allow but one degree of freedom in the gate characteristics. That is, the only effect of the statistical variation in the characteristics of the gate insulator is in one direction only and that would be in the longitudinal direction of the grown gate oxide 10. The variation of the impurity concentration of gate oxides in the width of strip 10 has been virtually eliminated by interdigitation and close proximity of the gate connections. The diffused viae are seen to be made in a compact mode such that the series drain and source resistances are minimized. The topology depicted in FIG. 1 also eliminates the need for two layers of metalization that is common in the prior art.

FIG. 2 shows a cross section of the device of FIG. 1 taken along line 2-2. Substrate 82 is seen to have diffused regions 20 and 30 located therein. Diffused region 20 is connected via connector 14 to pad 12 and serves as one of the plurality of source diffused regions. Similarly, diffused region 30 is connected to strip 23 of pad 22 via connection 96 and consist of one of the plurality of drain diffused regions of the first of said pair of complimentary transistors. Gate electrode 66 is shown deposited upon an etched portion of mask 84 and comes in contact with gate oxide 10 which is deposited directly adjacent substrate 82. Diffused regions 20 and 30 and gate oxide 10 represent one of the three distinct sections of the first of said complimentary pair of transistors; pads 12, 66 and 23 being their external electrical connectors. Pads 48, 74 and 36 are shown in this view in cross section inasmuch as they are electrical connectors for the second of said complimentary pair of transistors whose diffused regions and gate oxide portion is not shown in this figure. FIG. 2 also aids in understanding the well known mode of operation of the mOS transistor. In a preferred embodiment, 82 is N-type silicon into which is diffused two P-type regions 20 and 30 to form the source and the drain, respectively. A thin layer of gate oxide 10 is grown on the surface of substrate 82. Note that the ends 21 and 31 of diffused regions 20 and 30, respectively, just overlap the ends of gate oxide 10. A conductive path or channel is induced by an electric field due to a potential applied between gate 10 and substrate 82. When the gate potential is varied, the electric field is varied which modulates the channel resistance, producing the field effect transistor action in the well known manner.

FIG. 3 represents a cross sectional view of FIG. 1 taken along line 3—3. The cross section of FIG. 3 illustrates one of the three sets of diffused regions and gate oxide belonging to the second of said complimentary pair of MOS transistors. It is noted that FIG. 3 is essentially a mirror image of FIG. 2 but for pad 36 taken along a line perpendicular to the midpoint of gate oxide 10. Shown in FIG. 3 is the source pad 36 connected via contact opening 38 to diffused region 40. Conducting strip 48 of drain pad 46 is shown connected to diffused region 56 via contact opening 50. Gate connector strip 76 is shown in contact with gate oxide 10. Diffused regions 40 and 56 in combination with gate oxide 10 form one of the three of such sets that comprise the second of said complimentary pair of MOS transistors. The cross sectional view in FIG. 3 also shows source pad 12, drain strip 23, and gate strip 64 that belong to the first of said complimentary pair of transistors. The geometry of FIG. 3 is similar to that of FIG. 2 in that the ends 41 and 57 of diffused regions 50 and 56, respectively, just overlap the ends of gate oxide 10 so as to provide for channel formation upon the application of a potential between oxide 10 and substrate 82.

Figure 4A:
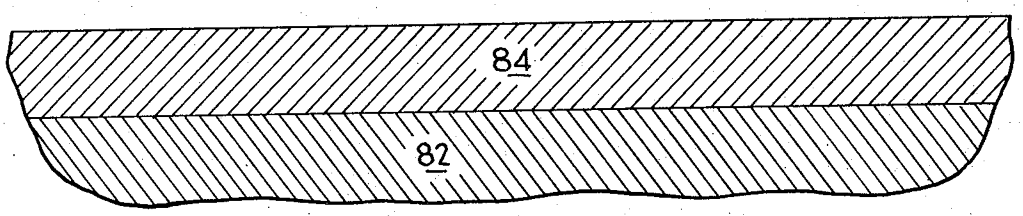
FIGS. 4A–4F illustrate in diagramatic form the novel process associated with the fabrication of the instant invention.
Figure 4B:
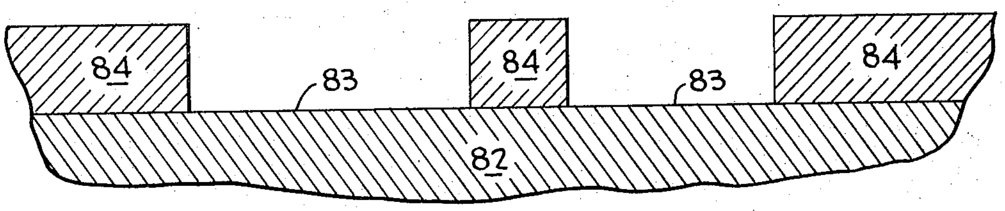
Figure 4C:
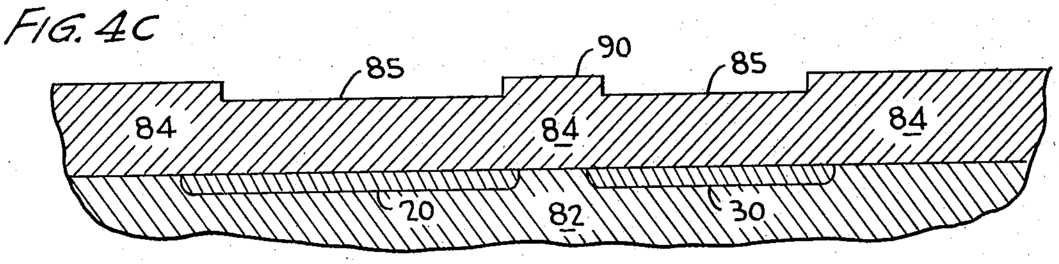
Figure 4D:
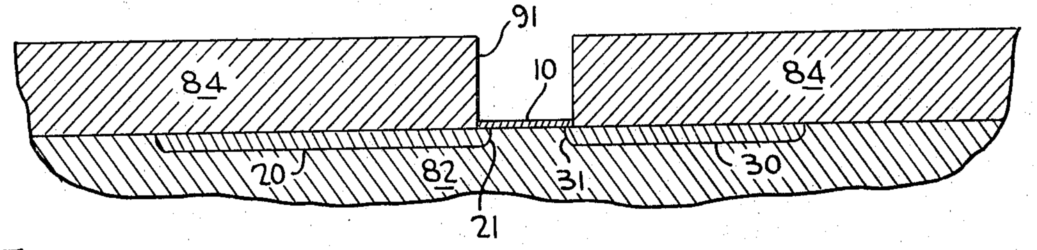
Figure 4E:
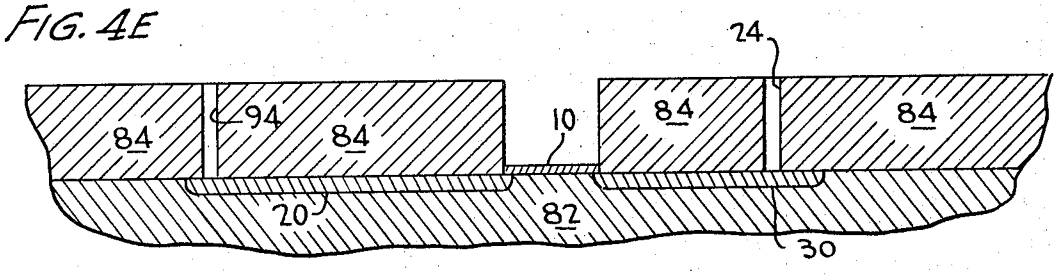
Figure 4F:
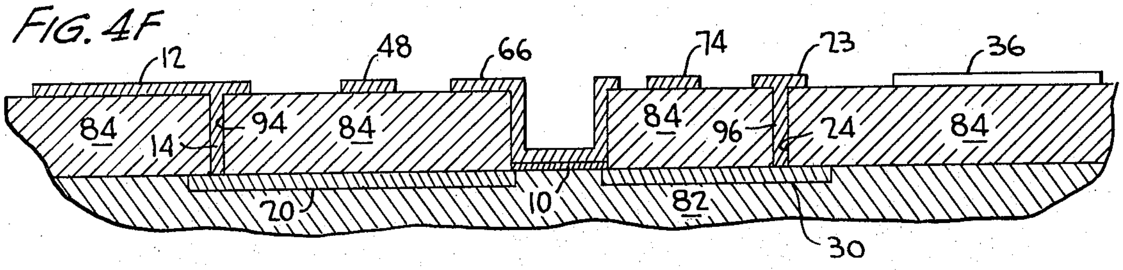

FIGS. 4A–4F illustrate the novel process associated with the fabrication of the device of the present invention. The final product in FIG. 4F is seen to be the cross section represented by FIG. 2, and it is understood that a similar process achieves the desired result with respect to the cross sections represented by FIG. 3 as well. FIG. 4A illustrates a substrate of bulk silicon 82 that is approximately 8 mils thick. Substrate 82 is placed in a furnace operating between 800° and 1,200° centigrade and, in the presence of oxygen, field oxide 84 having a thickness of 20,000–30,000 angstroms is grown on the top surface of substrate 82. FIG. 4B shows the substrate of FIG. 1 after windows 83 have been etched out by, for example, hydrogen fluoride. FIG. 4C represents the result of placing the device of FIG. 4B back into a furnace by which the oxide is regrown over windows 83 to produce steps 85. Also produced by this regrowth are two diffused regions 20 and 30 within substrate 82 just under the previous window portions 83. FIG. 4D illustrates the result of etching out portion 90 of FIG. 4C so as to open a gate window 91. Subsequent to the opening of gate window 91, gate oxide 10 is deposited in a long continuous strip therein. The diffused regions 20 and 30 continue to reform at their ends 21 and 31 respectively, so as to overlap either end of gate oxide strip 10. FIG. 4E represents the step of opening the contact windows 94 and 24 by means of an etching process using, for example, hydrogen fluoride. The contact windows 94 and 24 serve as means for making electrical connections to diffused regions 20 and 30, respectively. In FIG. 4F the device depicted in FIG. 4E has been subjected to a deposition process of an electrical conductor which can be, for example, aluminum. Subsequent to the deposition, the aluminum is etched away selectively so as to form the electrical conductors 12, 14, 48, 66, 74, 96, 23 and 36. The resultant depicted in FIG. 4F is the cross section shown in FIG. 2 and represents one of the three pairs of drain, source and gate regions that comprised the first of said complimentary pair of MOS transistors.

It is therefore seen that I have provided a complimentary pair of integrated MOS transistors that minimizes the variation in operating point from transistor to transistor having identical geometries. The topological method described herein for getting the oxide associated with each transistor very nearly the same limits the effect of the statistical variation in the gate insulation to 1° of freedom only. It is to be understood that while the device of the present invention has been described in a preferred embodiment form wherein each of the complimentary pairs of transistors comprises three drain-source-gate sections, more or less of such sections may be provided to optimize the matching characteristics and linearity of the devices. In a device constructed according to the principles of the present invention, 10 of such sets of gates, sources and drains for each transistor were interdigitated on a single chip. The device of the present invention provides equally spaced metalization layers for optimum utilization of space. The topology also provides compatability with normal MOS processing by necessitating only a single layer of metalization.

I wish it to be understood that I do not desire to be limited to the exact details of construction shown and described, for obvious modifications will occur to a person skilled in the art.

I claim as my invention:

1. A complementary pair of enhancement-type MOS transistors, comprising:

a. a semiconductor substrate of one conductivity type;
b. a plurality of first and second pairs of diffused regions of opposite conductivity type to said one conductivity type formed in said substrate;
c. a gate oxide extending along the surface of said substrate in a single continuous strip, located so as to bridge each of said first and second pairs of diffused regions;
d. means for electrically connecting in parallel the plurality of one of said first pair of diffused regions so as to form the source electrode for one of said pair of transistors;
e. means for electrically connecting in parallel the plurality of the other of said first pair of diffused regions so as to form the drain electrode for one of said pair of transistors;
f. means for electrically connecting in parallel the plurality of one of said second pair of diffused regions so as to form the source electrode for the other of said pair of transistors; and
g. means for electrically connecting in parallel the plurality of the other of said second pair of diffused regions so as to form the drain electrode for the other of said pair of transistors.

2. The transistors of claim 1 wherein said plurality of said first pair of said diffused regions are located in alternating positions along the length of and adjacent to said strip to said plurality of said second pair of said diffused regions.

3. The transistors of claim 2 further comprising first and second electrodes, each connected at a plurality of points to said gate oxide in parallel.

4. The transistors of claim 3 wherein said plurality of connecting points of said first electrode are located in alternating positions along the length of said gate oxide to said plurality of connecting points of said second electrode.

5. The transistors of claim 4 wherein said plurality of connecting points of said first electrode are further located over said gate oxide at positions corresponding to said bridge point of said oxide over said plurality of said first pair of diffused regions so as to form the gate electrode for one of said pair of transistors.

6. The transistors of claim 4 wherein said plurality of connecting points of said second electrode are further located over said gate oxide at positions corresponding to said bridge point of said oxide over said plurality of said second pair of diffused regions so as to form the gate electrode for the other of said pair of transistors.

7. A complementary pair of enhancement-type MOS transistors, comprising:

a semiconductor substrate of one conductivity type;

a plurality of first and second pairs of diffused regions of opposite conductivity type to said one conductivity type formed in said substrate;

a gate oxide extending along the surface of said substrate in a single continuous strip, located so as to bridge each of said first and second pairs of diffused regions so as to form the gate for both of said pair of transistors;

means for electrically connecting in parallel the plurality of one of said first pair of diffused regions so as to form the source electrode for one of said pair of transistors;

means for electrically connecting in parallel the plurality of the other of said first pair of diffused regions so as to form the drain electrode for one of said pair of transistors;

means for electrically connecting in parallel the plurality of one of said second pair of diffused regions so as to form the source electrode for the other of said pair of transistors; and means for electrically connecting in parallel the plurality of the other of siad second pair of diffused regions so as to form the drain electrode for the other of said pair of transistors; wherein said plurality of said first pair of said diffused regions are located in alternating positions along the length of and adjacent to said strip to said plurality of said second pair of said diffused regions.

* * * * *